United States Patent
Wu

(10) Patent No.: US 7,801,504 B2
(45) Date of Patent: Sep. 21, 2010

(54) COMMON-GATE COMMON-SOURCE TRANSCONDUCTANCE STAGE FOR RF DOWNCONVERSION MIXER

(75) Inventor: Yue Wu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 555 days.

(21) Appl. No.: 11/470,556

(22) Filed: Sep. 6, 2006

(65) Prior Publication Data
US 2007/0146071 A1 Jun. 28, 2007

Related U.S. Application Data

(60) Provisional application No. 60/748,854, filed on Dec. 8, 2005.

(51) Int. Cl.
H04B 1/26 (2006.01)
(52) U.S. Cl. .................. 455/313; 455/333; 455/323
(58) Field of Classification Search ......... 455/313–334; 327/358, 357
See application file for complete search history.

(56) References Cited

U.S. PATENT DOCUMENTS

| | | | | |
|---|---|---|---|---|
| 6,166,580 | A * | 12/2000 | Sessions | 327/333 |
| 6,417,712 | B1 * | 7/2002 | Beards et al. | 327/248 |
| 6,684,065 | B2 * | 1/2004 | Bult et al. | 455/252.1 |
| 6,891,423 | B2 | 5/2005 | Bjork et al. | |
| 7,161,406 | B1 * | 1/2007 | Ferris | 327/359 |
| 2002/0140495 | A1 * | 10/2002 | Wicke et al. | 327/530 |
| 2004/0056803 | A1 * | 3/2004 | Soutiaguine et al. | 343/846 |
| 2004/0130399 | A1 * | 7/2004 | Andreani et al. | 330/311 |
| 2006/0014515 | A1 * | 1/2006 | Ruelke et al. | 455/326 |
| 2006/0046370 | A1 * | 3/2006 | Oh et al. | 438/199 |
| 2006/0046681 | A1 * | 3/2006 | Bagheri et al. | 455/333 |
| 2006/0229046 | A1 * | 10/2006 | Bult et al. | 455/252.1 |
| 2007/0087720 | A1 * | 4/2007 | Pullela et al. | 455/323 |

OTHER PUBLICATIONS

Ravindran et al., "A Low Input Impedance Fully Differential CMOS Transresistance Amplifier Using Cascode Regulation," Custom Integrated Circuits Conference, 2005, Proceedings of the IEEE 2005 San Jose, CA, USA, Sep. 18-21, 2005, pp. 648-651, IEEE, Piscataway, NJ, USA, XP010873614.

Heydari P. et al., "A Performance Optimized CMOS Distributed LNA for UWB Receivers," Custom Integrated Circuits Conference, 2005, Proceedings of the IEEE 2005, San Jose, CA, USA, Sep. 18-21, 2005, pp. 330-333, IEEE, Piscataway, NJ, USA, XP010874156.

(Continued)

Primary Examiner—Lana N Le
(74) Attorney, Agent, or Firm—Jiayu Xu

(57) ABSTRACT

In an embodiment, a wireless device receiver chain includes a mixer with a common-gate common-source (CGCS) input stage. Differential signals from an off-chip matching network may be input to the CGCS input stage of the mixer, which downconverts the signals to baseband or some intermediate frequency. The input stage includes a pair of NMOS transistors in a common-gate configuration and a pair of PMOS transistors in a common-source configuration. A potential advantage of the CGCS input stage over the existing CGO transconductance stage configuration is that by adding a common-source stage through the PMOS differential-pair, the transconductance gain is decoupled from the high Q matching network.

7 Claims, 5 Drawing Sheets

OTHER PUBLICATIONS

International Search Report, PCT/US06/061819, International Search Authority, European Patent Office, May 6, 2008.

Written Opinion, PCT/US06/061819, International Search Authority, European Patent Office, May 6, 2008.

International Preliminary Report on Patentability, PCT/US06/061819, The International Bureau of WIPO, Geneva, Switzerland, Jun. 11, 2008.

* cited by examiner

… (1)

COMMON-GATE COMMON-SOURCE TRANSCONDUCTANCE STAGE FOR RF DOWNCONVERSION MIXER

CROSS-REFERENCE TO RELATED APPLICATION

This application claims priority to U.S. Provisional Patent Application No. 60/748,854, filed Dec. 8, 2005 and entitled, "COMMON-GATE COMMON-SOURCE TRANSCONDUCTANCE STAGE FOR RF DOWNCONVERSION MIXER."

BACKGROUND

Wireless communication networks are widely deployed to provide various communication services such as voice, packet data, broadcast, messaging, and so on. Examples of such wireless networks include Code Division Multiple Access (CDMA) networks, Time Division Multiple Access (TDMA) networks, Frequency Division Multiple Access (FDMA) networks, and Orthogonal FDMA (OFDMA) networks. These wireless networks may also utilize various radio technologies such as Wideband-CDMA (W-CDMA), cdma2000, and Global System for Mobile Communications (GSM).

Wireless devices used in such wireless networks include receiver sections for converting radio frequency (RF) signals received by an antenna to baseband signals for digital processing. FIG. 1 shows a portion of an exemplary receiver chain 100 in a wireless device. Wirelessly transmitted RF signals are received by antenna 102. The RF signals are amplified by an LNA (low noise amplifier) 104. The amplified signals are passed to an RF interstage bandpass filter 106, typically a surface acoustic-wave (SAW) filter, and the filtered signal is passed back to a mixer 108.

The LNA 104 and mixer 108 are typically provided on an integrated circuit ("IC" or "chip") 110, whereas the bandpass filter 106 is typically provided off-chip. A matching network (MN) 112 may be provided for impedance matching in passing filtered signals from the bandpass filter 106 back to the chip 110. The signals from the matching network 112 are input as differential signals to an input stage 114 of the mixer 108, which downconverts the signal to baseband or some intermediate frequency.

The input stage 114 of the mixer may have a conventional common-gate only (CGO) configuration, as shown in FIG. 2. Differential input signals 202, 204, which are identical but 180° out of phase, from the matching network are provided at the sources of NMOS transistors 206, 208, respectively. The gates of NMOS transistors 206, 208 are coupled through resistors 210, 212, providing the "common-gate" aspect of the circuit. The gate of each NMOS transistor 206, 208 is also cross-coupled to the opposite input signal than that provided to its source. PMOS transistors 220, 222 are connected at their gates through resistors 224, 226 to a constant voltage $V_g$ 228, and connected at their sources to supply voltage $V_{dd}$ 230. The current generated through each NMOS transistor is due to the input signals at its gate and source. The current through each PMOS transistor is constant due to the constant voltages provided at its gate and source. The total current $I_t$ is the sum of the current through the PMOS transistor and NMOS transistor on each column of the circuit.

For a CGO input stage, in order to achieve high gain, the transconductance $g_{mn}$ of the NMOS transistors must be relatively large, which requires a matching network with a very high Q matching factor. Consequently, a potential disadvantage for CGO input stage is high sensitivity to input Q matching factor.

SUMMARY

In an embodiment, a wireless device receiver chain includes a mixer with a common-gate common-source (CGCS) input stage. Differential signals from an off-chip matching network may be input to the CGCS input stage of the mixer, which downconverts the signals to baseband or some intermediate frequency. The input stage includes a common-gate stage, which may include a pair of NMOS transistors coupled to a differential input at their gates and sources, and a common-source stage, which may include a pair of PMOS transistors coupled to a current source at their sources, the differential inputs at their gates, and the common-gate stage at their drains, and RF choke inductors coupled between the differential input and ground.

A potential advantage of the CGCS input stage over the existing CGO transconductance stage configuration is that by adding a common-source stage through the PMOS differential-pair, the transconductance gain is decoupled from the high Q matching network.

DETAILED DESCRIPTION

Figure 1:
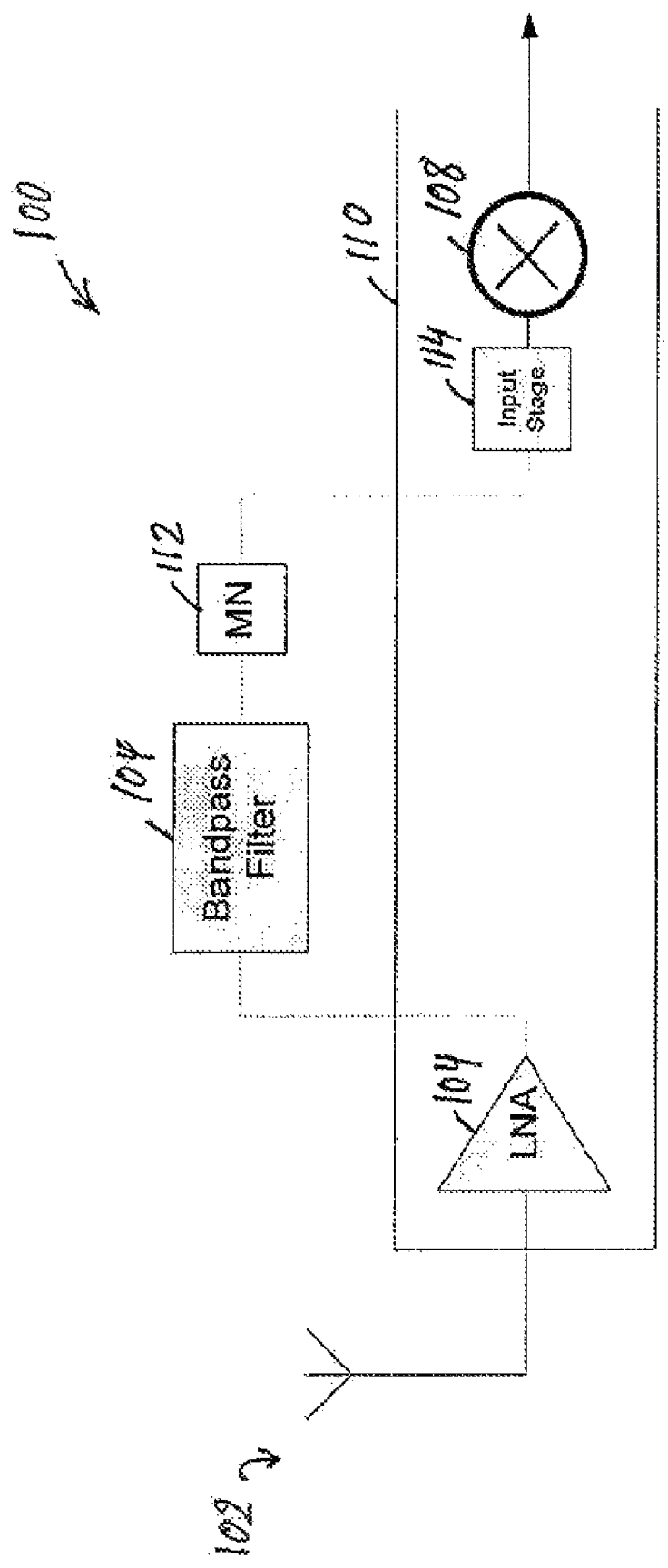
FIG. 1 shows a portion of receive chain in the transceiver of a wireless device.
Figure 2:
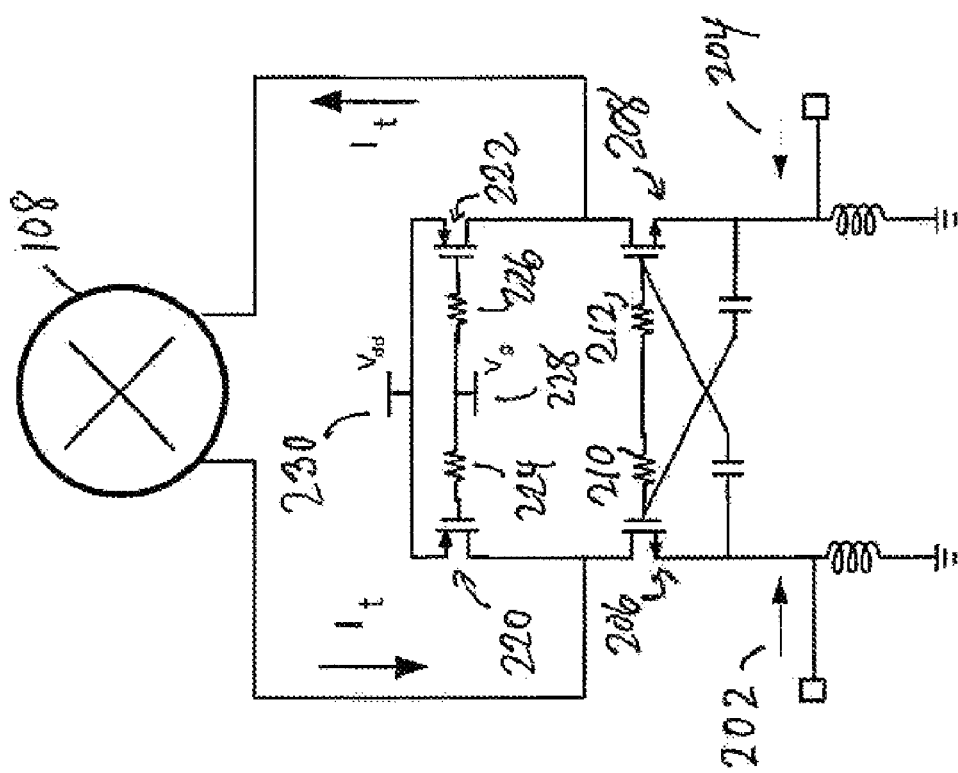
FIG. 2 is a block diagram of a common-gate only (CGO) input stage of the mixer in the receive chain of FIG. 1.
Figure 3:
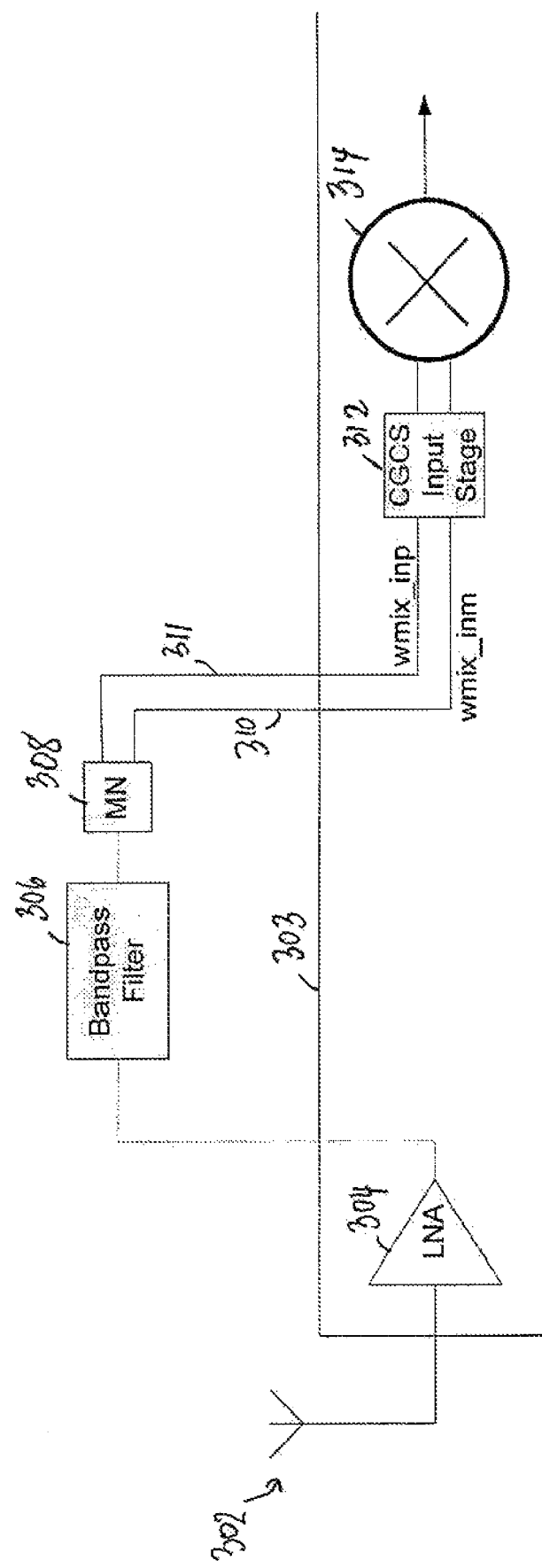
FIG. 3 shows a portion of a receive chain in a transceiver of a wireless device including a common-gate common-source (CGCS) input stage to the mixer.

FIG. 3 is a block diagram of a portion of a wireless device receiver chain including a mixer with a common-gate common-source (CGCS) input stage according to an embodiment.

RF signals received by antenna 302 are amplified by LNA 304 provided on a chip 303. The amplified signals are passed off-chip to a bandpass filter 306. A matching network 308 provides impedance matching for transmitting the filtered signals 310, 311 back on to chip 303. The differential signals are input to CGCS input stage 312 of mixer 314, which downconverts the signals to baseband or some intermediate frequency.

Figure 4:
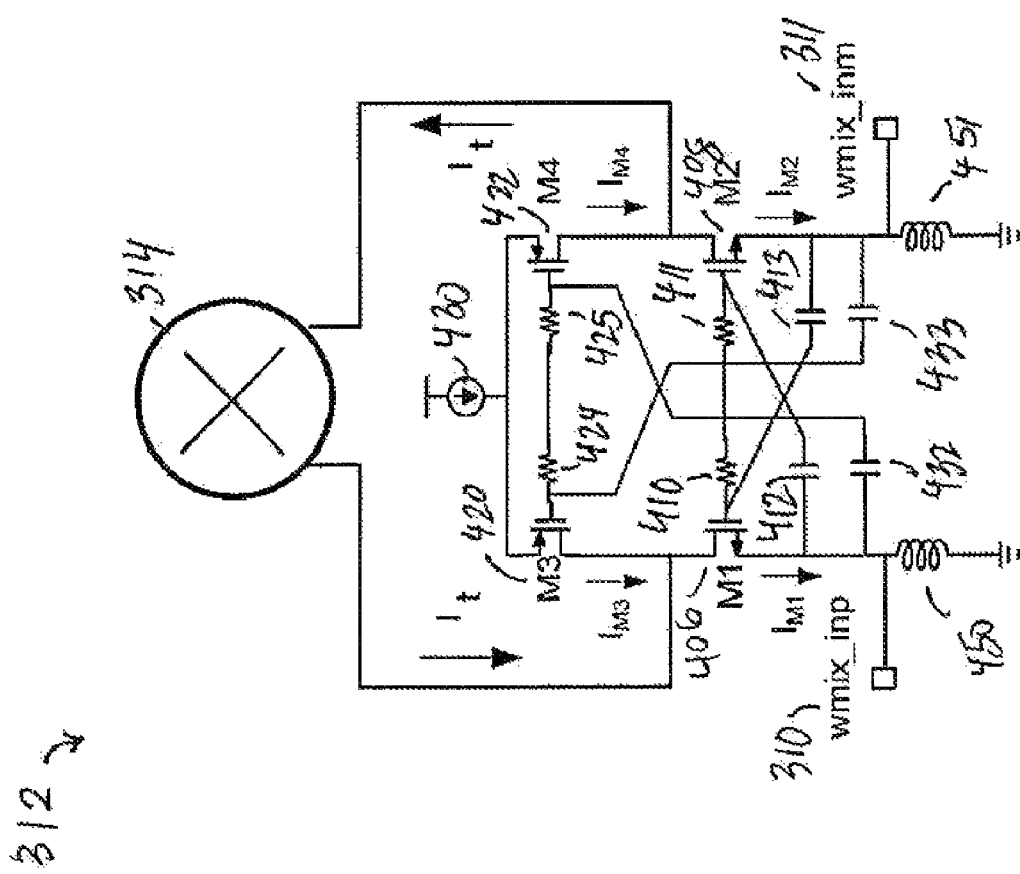
FIG. 4 illustrates an exemplary CGCS input stage.

FIG. 4. is a schematic diagram of the CGCS input stage 312 according to an embodiment. Differential input signals wimx_inp 310 and wmix_inm 311 from the matching network are provided at the sources of NMOS transistors M1 406 and M2 408, respectively. The differential input signals are 180° out of phase. The gates of NMOS transistors 406, 408 are coupled through resistors 410, 411, providing the "common-gate" aspect of the circuit. The gate of each NMOS transistor 406, 408 is also cross-coupled to the opposite input signal than its source through capacitors 412, 413, respectively. Current is generated through each NMOS transistor in response to the input signals at its gate and source.

PMOS transistors M3 420 and M4 422 are connected at their gates through resistors 424, 425. The sources of the PMOS transistors are tied to current source 430, providing the "common-source" aspect of the circuit. Like NMOS transistors 306, 408, the gate of each PMOS transistor 420, 422 is cross-coupled to the opposite input signal than its source through capacitors 432, 433, respectively. Current is generated through each PMOS transistor in response to the input signal at its gate and the current provided by current source 320. The total current $I_t$ is the sum of the current through the PMOS transistor and NMOS transistor on each column of the input stage.

Inductors 450 and 451 are coupled between the sources of the NMOS transistors 406 and 408, respectively, and a ground terminal. The inductors operative as RF choke inductors and exhibit high impedance at the operating frequency so that most signal current flow up into the transistors instead of ground during operation.

Figure 5:
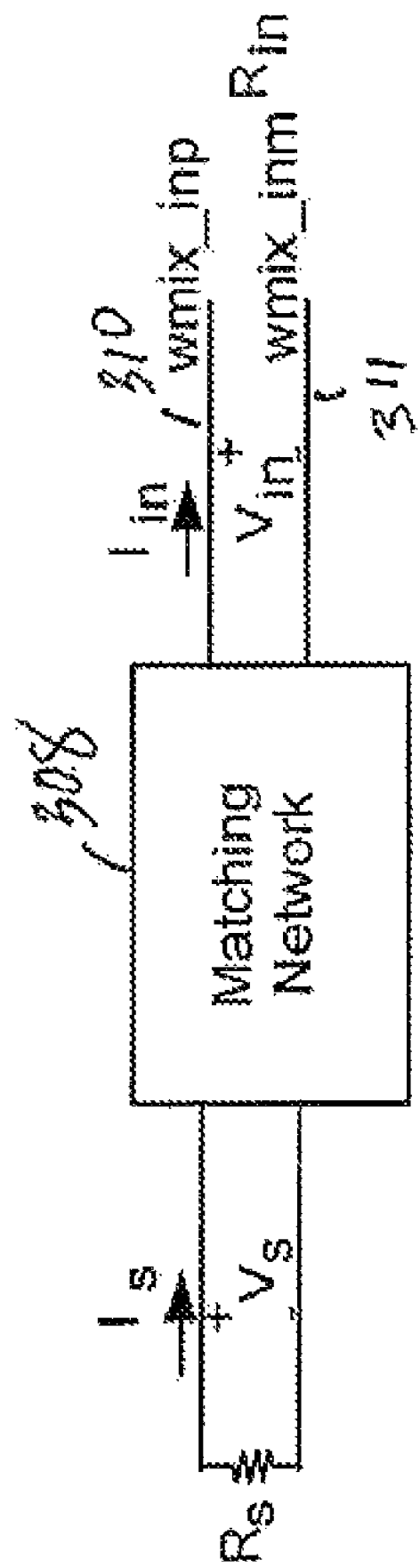
FIG. 5 is a block diagram of the signals input and output from the matching network.

A potential advantage of the CGCS input stage over the existing CGO transconductance stage configuration is that by adding a common-source stage through the PMOS differential-pair 420, 422, the transconductance gain is decoupled from the high Q matching network 308. FIG. 5 shows the signals at the input and output of the matching network 308. Assuming the matching network 308 is lossless, then:

$$\frac{I_{in}}{I_s} = \sqrt{\frac{R_s}{R_{in}}}$$

and $$\frac{V_{in}}{V_s} = \sqrt{\frac{R_{in}}{R_s}},$$

where $$R_{in} = \frac{1}{g_{mn}}$$

and $g_{mn}$ is the transconductance of the NMOS transistors.

Referring back the FIG. 4, the output current $I_t$ of the CGCS input stage 312 is given by the following equation:

$$I_t = I_s\sqrt{\frac{R_s}{R_{in}}} + g_{mp}V_s\sqrt{\frac{R_{in}}{R_s}} = V_s\frac{1}{\sqrt{R_s}}\left(\sqrt{g_{mn}} + \frac{g_{mp}}{\sqrt{g_{mn}}}\right),$$

where $g_{mp}$ is the transconductance of the PMOS transistors.

For a CGO stage, only the first term, $\sqrt{g_{mn}}$, exists. In order to achieve high gain, the NMOS transconductance $g_{mn}$ has to be sufficiently large, which in turn requires a very high Q matching network. In practice, providing a matching network with a very high Q factor may be difficult to implement and may increase the cost of external components.

The addition of the common-source stage adds the second term, $$\frac{g_{mp}}{\sqrt{g_{mn}}},$$

and will compensate for the gain if $g_{mn}$ is not sufficiently high and also relax the Q matching factor. Intuitively, to get high gain from a CGO transconductance stage, the voltage $V_{in}$ should be as small as possible, however low Q matching will cause $V_{in}$ to increase and cause a gain drop from the CGO stage. However, with the addition of the voltage-driven common-stage PMOS differential-pair, the $V_{in}$ increase may produce more current from the common-source stage and thus compensate the gain loss in the common-gate NMOS stage. This is an advantage of combining common-gate and common-source stages without introducing a power consumption penalty.

In an embodiment, a CGCS input stage for a receiver chain includes NMOS transistors M1 406 and M2 408 having a width of 300 μm and a length of 0.24 μm, and PMOS transistors M3 420 and M4 422 having a width of 240 μm and a length of 0.24 μm. The cross-coupled capacitors 412, 413 for the NMOS transistors may be about 6 pF, and cross-coupled capacitors 432, 433 for the PMOS transistors may be about 3 pF. The four resistors 410, 411, 424, and 425 may be about 10 kΩ and the two inductors 450, 451 may be about 9 nH.

A number of embodiments have been described. Nevertheless, it will be understood that various modifications may be made without departing from the spirit and scope of the invention. For example, the CSCG mixer input stage may be used in a variety of wireless devices having similar receivers, including those designed for use in wireless network systems, wireless local area networks, and/or wireless personal area networks. Accordingly, other embodiments are within the scope of the following claims.

I claim:

1. A wireless device receiver comprising:
   a matching network;
   a mixer; and
   a common-gate common-source (CGCS) mixer input stage including
      an input for receiving differential input signals from the matching network,
      a current source,
      a common-source stage including transistors coupled to the input and the current source,
      a common-gate stage including transistors coupled to the input and the common-source stage, and
      an output coupled to the mixer;
   wherein the transistors of the common-gate stage comprise a pair of N-channel Metal Oxide Semiconductor (NMOS) transistors, each NMOS transistor of the pair of NMOS transistors in the common-gate stage includes a drain coupled to the common-source stage, a gate coupled to one of the differential input signals, and a source coupled to another of the differential input signals.

2. A wireless device receiver comprising:
   a matching network;
   a mixer; and
   a common-gate common-source (CGCS) mixer input stage including
      an input for receiving differential input signals from the matching network,
      a current source,
      a common-source stage including transistors coupled to the input and the current source,
      a common-gate stage including transistors coupled to the input and the common-source stage, and
      an output coupled to the mixer;
   wherein the transistors of the common-source stage comprise a pair of P-channel Metal Oxide Semiconductor (PMOS) transistors, each PMOS transistor of the pair of PMOS transistors in the common-source stage includes a drain coupled to the common-gate stage, a gate coupled to one of the differential input signals, and a source coupled to the current source.

3. A wireless device receiver comprising:

a matching network;

a mixer; and a common-gate common-source (CGCS) mixer input stage including an input for receiving differential input signals from the matching network, a current source, a common-source stage including transistors coupled to the input and the current source, a common-gate stage including transistors coupled to the input and the common-source stage, and an output coupled to the mixer;

wherein an output current from the output of the CGCS mixer input stage satisfies the equation:

$$I_t = V_s \frac{1}{\sqrt{R_s}} \left( \sqrt{g_{mn}} + \frac{g_{mp}}{\sqrt{g_{mn}}} \right),$$

where $I_t$ is the output current, $V_s$ is a voltage at an input of the matching network, $R_s$ is a matching resistance, $g_{mn}$ is the transconductance of the transistors in the common-gate stage, and $g_{mp}$ is the transconductance of the transistors in the common-source stage.

4. A common-gate common-source (CGCS) transconductance stage comprising:

a current source;

a common-source stage including a first pair of transistors including a first transistor having a source coupled to the current source, a drain, and a gate coupled to a first differential input signal, and a second transistor having a source coupled to the current source, a drain, and a gate coupled to a second differential input signal and the gate of the first transistor;

a common-gate stage including a second pair of transistors, said second pair of transistors including a third transistor having a drain coupled to the drain of the first transistor, a gate coupled to the first differential input signal, and a source coupled to the second differential input signal, and a fourth transistor having a drain coupled to the drain of the second transistor, a gate coupled to the second differential input signal and the gate of the third transistor, and a source coupled to the first differential input signal;

a first output to a mixer coupled between the drains of the first and third transistors; and a second output to the mixer coupled between the drains of the second and fourth transistors.

5. The CGCS transconductance stage of claim 4, further comprising:

a first inductor coupled between the source of the third transistor and a ground terminal; and a second inductor coupled between the source of the fourth transistor and the ground terminal.

6. The CGCS transconductance stage of claim 4, wherein the first and second transistors comprise PMOS transistors.

7. The CGCS transconductance stage of claim 4, wherein the third and fourth transistors comprise NMOS transistors.

* * * * *